(12) United States Patent
Sakui et al.

(10) Patent No.: US 12,362,006 B2
(45) Date of Patent: Jul. 15, 2025

(54) SEMICONDUCTOR-ELEMENT-INCLUDING MEMORY DEVICE

(71) Applicant: Unisantis Electronics Singapore Pte. Ltd., Singapore (SG)

(72) Inventors: Koji Sakui, Tokyo (JP); Masakazu Kakumu, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 246 days.

(21) Appl. No.: 18/333,674

(22) Filed: Jun. 13, 2023

(65) Prior Publication Data

US 2023/0402090 A1 Dec. 14, 2023

(30) Foreign Application Priority Data

Jun. 14, 2022 (WO) ............... PCT/JP2022/023825

(51) Int. Cl.
*G11C 7/00* (2006.01)
*G11C 11/408* (2006.01)
(Continued)

(52) U.S. Cl.
CPC ...... *G11C 11/4096* (2013.01); *G11C 11/4087* (2013.01); *G11C 11/4091* (2013.01); *H10B 12/20* (2023.02)

(58) Field of Classification Search
CPC ............ G11C 11/4086; G11C 11/4087; G11C 11/4091; H01B 12/20
(Continued)

(56) References Cited

U.S. PATENT DOCUMENTS

| 11,763,877 B2 * | 9/2023 | Sakui | ............ G11C 7/04 365/185.29 |
| 11,776,620 B2 * | 10/2023 | Sakui | ............ H10B 12/00 365/189.011 |

(Continued)

FOREIGN PATENT DOCUMENTS

| JP | H02-188966 A | 7/1990 |
| JP | H03-171768 A | 7/1991 |
| JP | 7057032 B1 | 4/2022 |

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: "Impact of Surrounding Gate Transistor (SGT) for Ultra-High-Density LSI's", IEEE Transaction on Electron Devices, vol. 38, No. 3, 99573-578 (Mar. 1991).

(Continued)

*Primary Examiner* — Viet Q Nguyen
(74) *Attorney, Agent, or Firm* — Crowell & Moring LLP

(57) ABSTRACT

A memory device includes pages each including memory cells arranged in columns in plan view on a substrate, and voltages applied to first and second gate conductor layers and first and second impurity regions in each memory cell are controlled to retain a group of positive holes, generated by an impact ionization phenomenon, inside a semiconductor body. The first and second impurity regions are connected to source and bit lines, the first and second gate conductor layers are connected to word and plate lines, and voltages applied to these lines are controlled to perform a page write operation, a page erase operation, and a page read operation. In the page write operation, the group of positive holes are retained inside the semiconductor body at a first time, and a page write post-processing operation of making a group of excess positive holes disappear is performed at a second time.

18 Claims, 12 Drawing Sheets

(51) Int. Cl.
*G11C 11/4091* (2006.01)
*G11C 11/4096* (2006.01)
*H10B 12/00* (2023.01)

(58) Field of Classification Search
USPC .................................................. 365/189.011
See application file for complete search history.

(56) References Cited

U.S. PATENT DOCUMENTS

| | | | | |
|---|---|---|---|---|
| 11,823,726 | B2* | 11/2023 | Sakui | G11C 16/0466 |
| 11,823,727 | B2* | 11/2023 | Sakui | G11C 16/14 |
| 11,917,204 | B2* | 2/2024 | Lim | H04N 19/82 |
| 11,917,807 | B2* | 2/2024 | Sakui | H10D 30/711 |
| 11,937,418 | B2* | 3/2024 | Sakui | G11C 11/4091 |
| 11,990,204 | B2* | 5/2024 | Sakui | G11C 11/404 |
| 12,100,443 | B2* | 9/2024 | Sakui | G11C 16/24 |
| 12,131,773 | B2* | 10/2024 | Sakui | G11C 16/10 |
| 12,166,107 | B2* | 12/2024 | Sakui | H10D 30/025 |
| 12,205,629 | B2* | 1/2025 | Sakui | G11C 11/401 |
| 12,249,366 | B2* | 3/2025 | Sakui | G11C 16/08 |
| 2003/0111681 | A1 | 6/2003 | Kawanaka | |
| 2008/0137394 | A1 | 6/2008 | Shimano et al. | |
| 2022/0406781 | A1* | 12/2022 | Sakui | G11C 11/406 |
| 2023/0115460 | A1* | 4/2023 | Sakui | G11C 11/4096 |
| | | | | 365/184 |

OTHER PUBLICATIONS

H. Chung, H. Kim, H. Kim, K. Kim, S. Kim, K. W.Song, J. Kim, Y.C. Oh, Y. Hwang, H. Hong, G. Jin, and C. Chung: "Novel 4F2 DRAM Cell with Vertical Pillar Transistor(VPT)," 2011 Proceeding of the European Solid-State Device Research Conference, (2011).
H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No. 12, December, 992201-2227 (2010).
K. Tsunoda, K .Kinoshita, H. Noshiro, Y. Yamazaki, T. Iizuka, Y. Ito, A. Takahashi, A. Okano, Y. Sato, T. Fukano, M. Aoki, and Y. Sugiyama : "Low Power and high Speed Switching of Ti-doped NiO ReRAM under the Unipolar Voltage Source of less than 3V," IEDM (2007), 99 767-770.
W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, vol. 62, No. 6, pp.1-9 (Jun. 2015).
M. G. Ertosun, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, vol. 31, No. 5, pp. 405-407 (May 2010).
J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012).
T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002).
T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32mm Node and Beyond," IEEE IEDM (2006).
J. Y. Song, W. Y. Choi, J. H. Park, J. D. Lee, and B-G. Park: "Design Optimization of Gate-All-Around (GAA) MOSFETs," IEEE Trans. Electron Devices, vol. 5, No. 3, pp. 186-191, May 2006.
N. Loubet, et al.: "Stacked Nanosheet Gate-All-Around Transistor to Enable Scaling Beyond FinFET," 2017 IEEE Symposium on VLSI Technology Digest of Technical Pagers, T17-5, T230-T231, Jun. 2017.
H. Jiang, N. Xu, B. Chen, L. Zeng1, Y. He, G. Du, X. Liu and X. Zhang: "Experimental investigation of self heating effect (SHE) in multiple-fin SOI F inFETs," Semicond. Sci. Technol. 29 (2014) 115021 (7pp).
E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.
F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI,"IEICE Trans. Electron., vol. E90-c., No. 4 pp.765-771 (2007).
K.Sakui, N. Harada,"Dynamic Flash Memory with Dual Gate Surrounding Gate Transistor (SGT),"Proc. IEEE IMW, pp. 72-75(2021).
International Search Report and Written Opinion in Application No. PCT/JP2022/023825, dated Aug. 16, 2022 (13773-427_255PCT ISR&WO.pdf).
International Preliminary Report on Patentability (English translation) in International Application No. PCT/JP2022/023825 dated Dec. 26, 2024 (5 pages).

* cited by examiner $$V_{FB}"1" = Vb - \beta_{WL} \times Vt_{WL}"1" - \beta_{BL} \times V_{BLH} \quad (1)$$

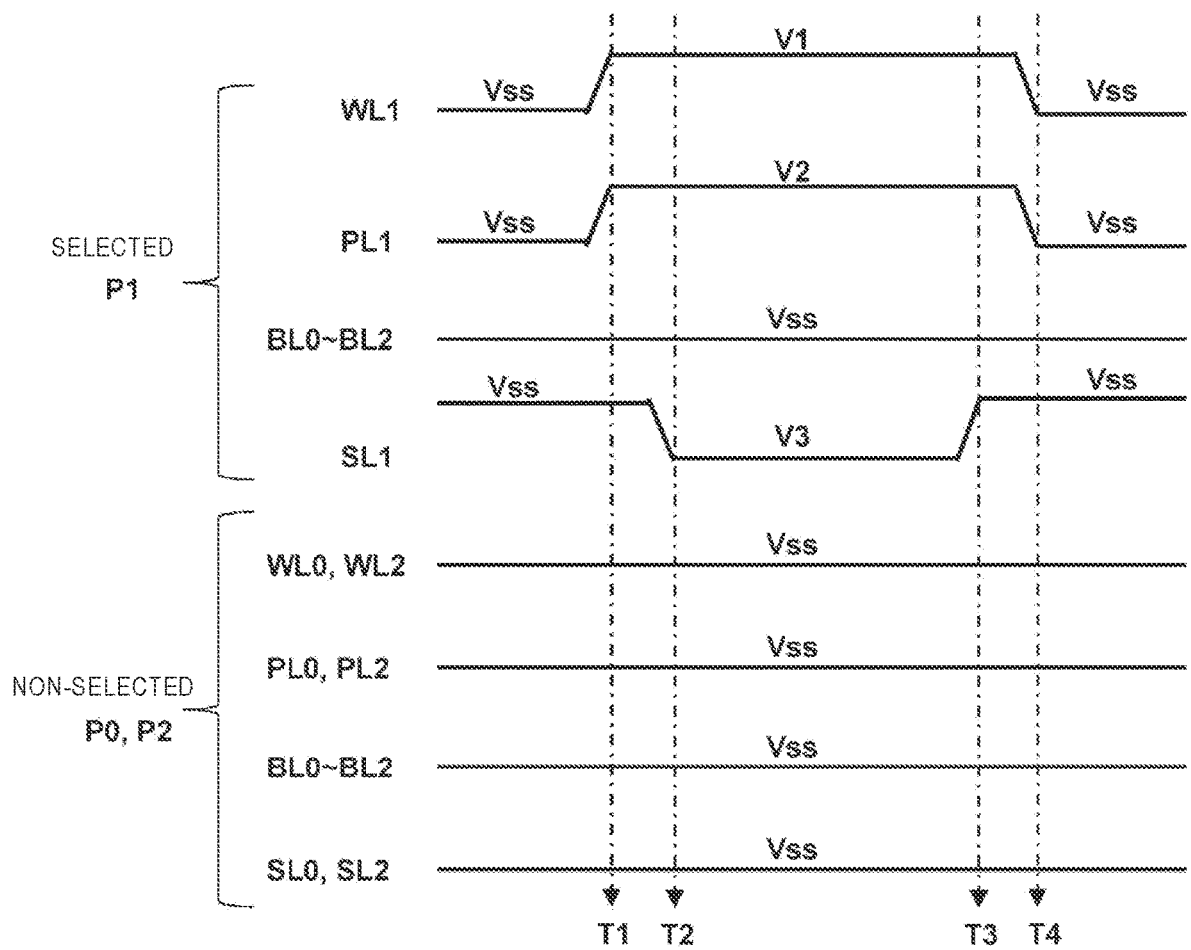

$V_{FB}"1" = Vb$
Vb: BUILT-IN VOLTAGE

Vb: Built-in Voltage~0.7V

SEMICONDUCTOR-ELEMENT-INCLUDING MEMORY DEVICE

CROSS REFERENCES TO RELATED APPLICATIONS

This application claims priority to PCT/JP2022/023825, filed Jun. 14, 2022, the entire content of which is incorporated herein by reference.

BACKGROUND OF THE INVENTION

1. Field of the Invention

The present invention relates to a semiconductor-element-including memory device.

2. Description of the Related Art

Recently, there has been a demand for highly integrated and high-performance memory elements in the development of LSI (Large Scale Integration) technology.

High-density and high-performance memory elements are being developed. SGTs (Surrounding Gate Transistors, see Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)) can be used as selection transistors for, for example, a DRAM (Dynamic Random Access Memory, see, for example, H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011)) to which a capacitor is connected, a PCM (Phase Change Memory, see, for example, H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No. 12, December, pp. 2201-2227 (2010)) to which a resistance change element is connected, an RRAM (Resistive Random Access Memory, see, for example, T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V", IEDM (2007)), and an MRAM (Magneto-resistive Random Access Memory, see, for example, W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015)) that changes the resistance by changing the orientation of a magnetic spin with a current.

There exists, for example, a DRAM memory cell (see Japanese Unexamined Patent Application Publication No. 3-171768, M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron", IEEE Electron Device Letter, Vol. 31, No. 5, pp. 405-407 (2010), J. Wan, L. Rojer, A. Zaslaysky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida: "A Capacitorless 1T-DRAM Technology Using Gate-Induced Drain Leakage (GIDL) Current for Low-Power and High-Speed Embedded Memory", IEEE IEDM (2006)) constituted by a single MOS transistor and including no capacitor. For example, among a group of positive holes and electrons generated inside the channel by an impact ionization phenomenon caused by a current between the source and the drain of the N-channel MOS transistor, some or all of the group of positive holes are retained in the channel to write logical storage data "1". The group of positive holes are discharged from inside the channel to write logical storage data "0". With respect to the above-described memory cell, for a common selected word line, a memory cell to which "1" is written and a memory cell to which "0" is written are present at random. When an ON voltage is applied to the selected word line, the floating body channel voltage of a selected memory cell connected to the selected word line changes to a large degree due to capacitive coupling between the gate electrode and the channel. This memory cell has a problem that it experiences a decrease in the operation margin caused by the change in the floating body channel voltage and a decrease in the data retention performance caused by discharge of some of the group of positive holes that are signal charges stored in the channel, which are to be reduced.

There exist twin-transistor MOS transistor memory elements in which a single memory cell is formed in an SOI layer by using two MOS transistors (see, for example, US2008/0137394 A1, US2003/0111681 A1, and F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI", IEICE Trans. Electron., Vol. E90-c., No. 4 pp. 765-771 (2007)). In these elements, an $N^+$ layer that functions as the source or the drain and that separates the floating body channels of the two MOS transistors is formed so as to be in contact with an insulating layer that is on the substrate side. This $N^+$ layer electrically isolates the floating body channels of the two MOS transistors from each other. A group of positive holes that are signal charges are stored only in the floating body channel of one of the MOS transistors. The other MOS transistor functions as a switch for reading the group of positive holes that are signal charges stored in the one of the MOS transistors. Also in this memory cell, the group of positive holes that are signal charges are stored in the channel of the one of the MOS transistors, and therefore, the memory cell has a problem that it experiences a decrease in the operation margin or a decrease in the data retention performance caused by discharge of some of the group of positive holes that are signal charges stored in the channel, which is to be reduced, as in the above-described memory cell constituted by a single MOS transistor.

There exists a memory cell 111 constituted by a MOS transistor and including no capacitor illustrated in FIG. 5A (see Japanese Patent No. 7057032 and K. Sakui, N. Harada, "Dynamic Flash Memory with Dual Gate Surrounding Gate Transistor (SGT)", Proc. IEEE IMW, pp. 72-75 (2021)). As illustrated in FIG. 5A, a floating-body semiconductor body 102 is disposed on a $SiO_2$ layer 101 of an SOI substrate. An $N^+$ layer 103 connected to a source line SL and an $N^+$ layer 104 connected to a bit line BL are disposed at the respective ends of the floating-body semiconductor body 102. A first gate insulator layer 109a is connected to the N$^+$ layer 103 and covers the floating-body semiconductor body 102, and a second gate insulator layer 109b is connected to the N$^+$ layer 104, is connected to the first gate insulator layer 109a with a slit insulating film 110 therebetween, and covers the floating-body semiconductor body 102. A first gate conductor layer 105a covers the first gate insulator layer 109a and is connected to a plate line PL, and a second gate conductor layer 105b covers the second gate insulator layer 109b and is connected to a word line WL. Between the first gate conductor layer 105a and the second gate conductor layer 105b, the insulating layer 110 is disposed. These constitute the memory cell 111 of a DFM (dynamic flash memory). The source line SL may be connected to the N$^+$ layer 104 and the bit line BL may be connected to the N$^+$ layer 103.

As illustrated in FIG. 5A, for example, a zero voltage is applied to the N$^+$ layer 103 and a positive voltage is applied to the N$^+$ layer 104 to operate a first N-channel MOS transistor region that is a part of the floating-body semiconductor body 102 covered by the first gate conductor layer 105a in the saturation region and to operate a second N-channel MOS transistor region that is a part of the floating-body semiconductor body 102 covered by the second gate conductor layer 105b in the linear region. As a result, a pinch-off point is not present in the second N-channel MOS transistor region and an inversion layer 107b is formed on the entire surface. The inversion layer 107b that is formed below the second gate conductor layer 105b to which the word line WL is connected substantially functions as the drain of the first N-channel MOS transistor region. As a result, the electric field becomes maximum in a boundary region of the semiconductor body between the first N-channel MOS transistor region and the second N-channel MOS transistor region, and an impact ionization phenomenon occurs in this region. As illustrated in FIG. 5B, among a group of electrons and positive holes generated by the impact ionization phenomenon, the group of electrons are discharged from the floating-body semiconductor body 102 and some or all of a group of positive holes 106 are retained in the floating-body semiconductor body 102 to thereby perform a memory write operation. This state corresponds to logical storage data "1".

As illustrated in FIG. 5C, for example, a positive voltage is applied to the plate line PL, a zero voltage is applied to the word line WL and the bit line BL, and a negative voltage is applied to the source line SL to discharge the group of positive holes 106 from the floating-body semiconductor body 102 and perform an erase operation. This state corresponds to logical storage data "0". When the voltage applied to the first gate conductor layer 105a connected to the plate line PL is set to a voltage higher than a threshold voltage at the time of logical storage data "1" and lower than a threshold voltage at the time of logical storage data "0" in data reading, a property that a current does not flow even when the voltage of the word line WL is increased in reading of logical storage data "0" can be attained as illustrated in FIG. 5D. With this property, the operation margin can be increased to a large degree compared to the above-described memory cells. In the memory cell described here, the channels of the first and second N-channel MOS transistor regions respectively having the first gate conductor layer 105a connected to the plate line PL and the second gate conductor layer 105b connected to the word line WL as their gates are connected in the floating-body semiconductor body 102, which significantly reduces a change in the voltage of the floating-body semiconductor body 102 occurring in response to application of a selection pulse voltage to the word line WL. Accordingly, the decrease in the operation margin or the decrease in the data retention performance caused by discharge of some of the group of positive holes that are signal charges stored in the channel, which is a problem of the above-described memory cells, can be reduced to a large degree. In the future, further improvement of the properties of the memory element will be required.

SUMMARY OF THE INVENTION

A dynamic flash memory cell is required to perform a stable page write operation and prevent a malfunction of a sense amplifier circuit.

To address the above-described problems, a semiconductor-element-including memory device according to the present invention is
  a memory device in which in plan view on a substrate, a
    plurality of pages are arranged in a column direction,
    each of the pages being constituted by a plurality of
    memory cells arranged in a row direction,
  each of the memory cells included in each of the pages
    including:
  a semiconductor body that stands on the substrate in a
    vertical direction or that extends along the substrate in
    a horizontal direction;
  a first impurity region and a second impurity region that
    are disposed at respective ends of the semiconductor
    body;
  a gate insulator layer that is in contact with a side surface
    of the semiconductor body between the first impurity
    region and the second impurity region;
  a first gate conductor layer that partially or entirely covers
    the gate insulator layer; and
  a second gate conductor layer that is adjacent to the first
    gate conductor layer and that is in contact with a side
    surface of the gate insulator layer, in which voltages
    applied to the first impurity region, the second impurity
    region, the first gate conductor layer, and the second
    gate conductor layer are controlled to perform a page
    write operation, a page erase operation, and a page read
    operation, and
  in the page write operation, a group of positive holes
    generated by an impact ionization phenomenon are
    retained inside the semiconductor body at a first time,
    and a page write post-processing operation of making
    a group of excess positive holes among the group of
    positive holes disappear is performed at a second time
    subsequent to the first time (first invention).
  In the first invention described above, in the page write
operation, a voltage of the semiconductor body is made
equal to a first data retention voltage that is higher than a
voltage of one of the first impurity region or the second
impurity region or higher than voltages of both of the first
impurity region and the second impurity region, and
  in the page erase operation, the voltages applied to the
    first impurity region, the second impurity region, the
    first gate conductor layer, and the second gate conductor layer are controlled to make the group of positive
    holes in the semiconductor body disappear, and the
    voltage of the semiconductor body is made equal to a
    second data retention voltage that is lower than the first
    data retention voltage (second invention).
  In the first invention described above, the first impurity
region is connected to a source line, the second impurity
region is connected to a bit line, one of the first gate conductor layer or the second gate conductor layer is connected to a word line, and the other of the first gate conductor layer or the second gate conductor layer is connected to a plate line, and voltages applied to the source line, the bit line, the word line, and the plate line are controlled to perform the page write operation, the page erase operation, the page read operation, and the page write post-processing operation (third invention).

In the third invention described above, in the page write post-processing operation, a pulse voltage is applied to at least one of the source line, the bit line, the word line, or the plate line (fourth invention).

In the third invention described above, in the page write post-processing operation, voltages identical to voltages applied in the page read operation are applied to the bit line, the word line, and the plate line (fifth invention).

In the third invention described above, in the page write post-processing operation, a voltage higher than a voltage applied in the page read operation is applied to at least one of the bit line, the word line, or the plate line (sixth invention).

In the fourth invention described above, in the page write post-processing operation, the pulse voltage is applied at least once to a page selected from among the pages (seventh invention).

In the third invention described above, the word line and the plate line are disposed in parallel in plan view, and the bit line is disposed in a direction perpendicular to the word line and the plate line in plan view (eighth invention).

In the third invention described above, a first gate capacitance between the semiconductor body and the first gate conductor layer or the second gate conductor layer to which the plate line is connected is larger than a second gate capacitance between the semiconductor body and the first gate conductor layer or the second gate conductor layer to which the word line is connected (ninth invention).

In the third invention described above, in plan view, the source line includes isolated source lines that are disposed for respective groups of memory cells arranged in the column direction and that are disposed parallel to the word line and the plate line (tenth invention).

In the third invention described above, in plan view, the source line is disposed so as to be shared between pages adjacent to each other (eleventh invention).

In the third invention described above, in plan view, the plate line is disposed so as to be shared between at least two or more pages adjacent to each other (twelfth invention).

In the first invention described above, the first gate conductor layer is constituted by two divided gate conductor layers isolated from each other, and the divided gate conductor layers are positioned on respective sides of the second gate conductor layer, and the page write operation, the page erase operation, the page read operation, and the page write post-processing operation are performed (thirteenth invention).

In the first invention described above, the second gate conductor layer is constituted by two divided gate conductor layers isolated from each other, and the divided gate conductor layers are positioned on respective sides of the first gate conductor layer, and the page write operation, the page erase operation, the page read operation, and the page write post-processing operation are performed (fourteenth invention).

In the first invention described above, the semiconductor body is a P-type semiconductor layer, and the first impurity region and the second impurity region are N-type semiconductor layers (fifteenth invention).

In the first invention described above, in the page erase operation, selective erasing is performed for at least two pages (sixteenth invention).

In the third invention described above, the word line and the plate line are connected to a row decoder circuit, the row decoder circuit receives a row address, and a page is selected from among the pages in accordance with the row address (seventeenth invention).

In the third invention described above, the bit line is connected to a sense amplifier circuit, the sense amplifier circuit is connected to a column decoder circuit, the column decoder circuit receives a column address, and the sense amplifier circuit is selectively connected to an input/output circuit in accordance with the column address (eighteenth invention).

BRIEF DESCRIPTION OF THE DRAWINGS

FIG. 4B is a diagram for explaining the mechanism of the page erase operation of the memory device according to the first embodiment;

DESCRIPTION OF THE PREFERRED EMBODIMENTS

Hereinafter, a semiconductor-element-including memory device (hereinafter called a dynamic flash memory) according to embodiments of the present invention will be described with reference to the drawings.

First Embodiment

The structure and operation mechanisms of a dynamic flash memory cell according to a first embodiment of the present invention will be described with reference to FIG. 1 to FIGS. 4A to 4E. The structure of the dynamic flash memory cell will be described with reference to FIG. 1. A mechanism of a page write operation will be described with reference to FIGS. 2AA to 2AC and FIG. 2B, a page write post-processing operation will be described with reference to FIGS. 3A to 3C, and a mechanism of a page erase operation will be described with reference to FIGS. 4A to 4E.

Figure 1:
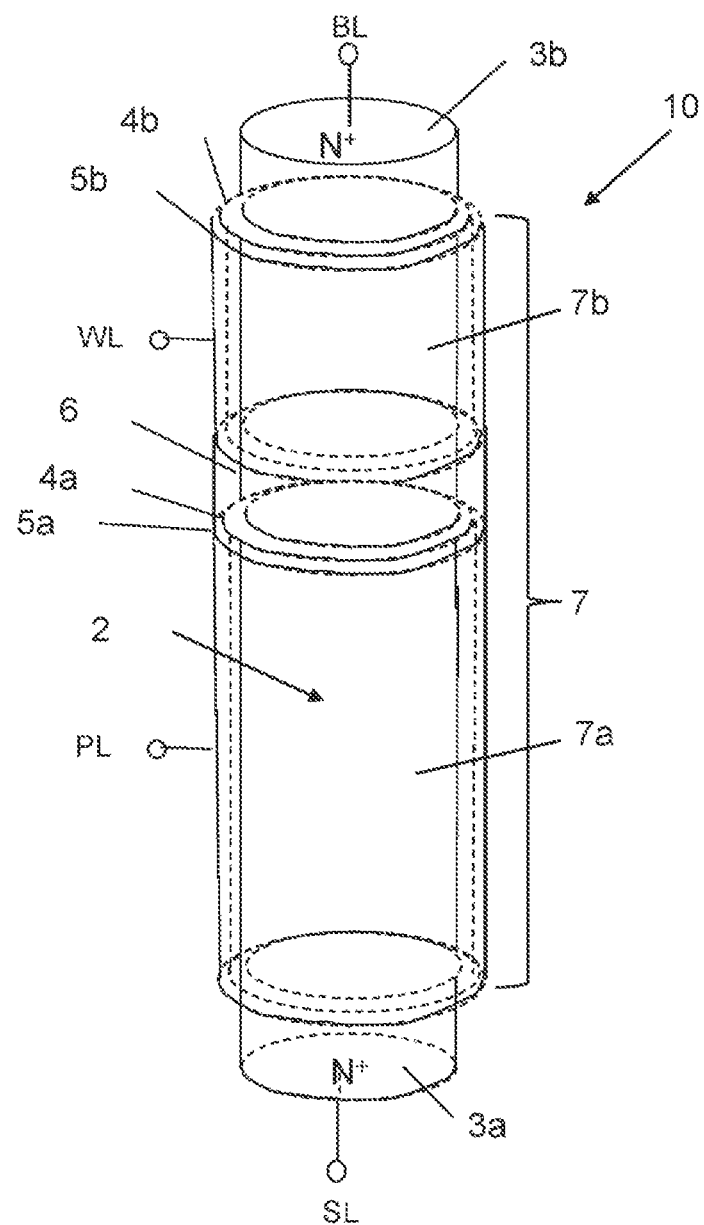
FIG. 1 is a structural diagram of an SGT-including memory device according to a first embodiment.

FIG. 1 illustrates the structure of the dynamic flash memory cell according to the first embodiment of the present invention. On the top and the bottom of a silicon semiconductor column 2 (the silicon semiconductor column is hereinafter referred to as "Si column") (which is an example of "semiconductor body" in the claims) of the P or i (intrinsic) conductivity type formed on a substrate, N+ layers 3a and 3b (which are examples of "first impurity region" and "second impurity region" in the claims), one of which functions as the source and the other functions as the drain, are formed respectively. The part of the Si column 2 between the N+ layers 3a and 3b that function as the source and the drain functions as a semiconductor body 7. Around the semiconductor body 7, a first gate insulator layer 4a (which is an example of "first gate insulator layer" in the claims) and a second gate insulator layer 4b (which is an example of "second gate insulator layer" in the claims) are formed. The first gate insulator layer 4a and the second gate insulator layer 4b are in contact with or in close vicinity to the N+ layers 3a and 3b that function as the source and the drain respectively. Around the first gate insulator layer 4a and the second gate insulator layer 4b, a first gate conductor layer 5a (which is an example of "first gate conductor layer" in the claims) and a second gate conductor layer 5b (which is an example of "second gate conductor layer" in the claims) are formed respectively. The first gate conductor layer 5a and the second gate conductor layer 5b are isolated from each other by an insulating layer 6. The semiconductor body 7 between the N+ layers 3a and 3b is constituted by a first semiconductor body 7a surrounded by the first gate insulator layer 4a and a second semiconductor body 7b surrounded by the second gate insulator layer 4b. Accordingly, the N+ layers 3a and 3b that function as the source and the drain, the semiconductor body 7, the first gate insulator layer 4a, the second gate insulator layer 4b, the first gate conductor layer 5a, and the second gate conductor layer 5b constitute a dynamic flash memory cell 10. The N+ layer 3a that functions as the source is connected to a source line SL (which is an example of "source line" in the claims), the N+ layer 3b that functions as the drain is connected to a bit line BL (which is an example of "bit line" in the claims), the first gate conductor layer 5a is connected to a plate line PL (which is an example of "plate line" in the claims), and the second gate conductor layer 5b is connected to a word line WL (which is an example of "word line" in the claims). Desirably, the dynamic flash memory cell has a structure in which a first gate capacitance (which is an example of "first gate capacitance" in the claims) of the first gate conductor layer 5a to which the plate line PL is connected is larger than a second gate capacitance (which is an example of "second gate capacitance" in the claims) of the second gate conductor layer 5b to which the word line WL is connected. Note that one of the first gate conductor layer or the second gate conductor layer 5b may be divided into two gate conductor layers. In this case, it is desirable to dispose the divided two gate conductor layers on the respective sides of the first gate conductor layer 5a or the second gate conductor layer 5b that is not divided.

Figure 2A:
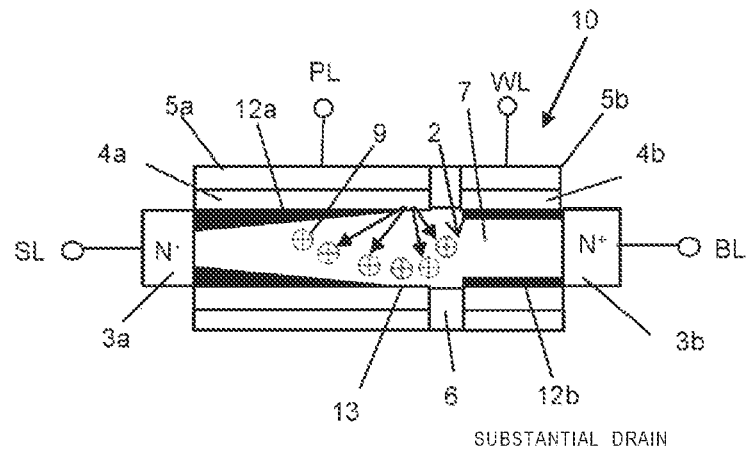
FIGS. 2AA, 2AB and 2AC are diagrams for explaining a mechanism of a page write operation of the memory device according to the first embodiment.
Figure 2A:
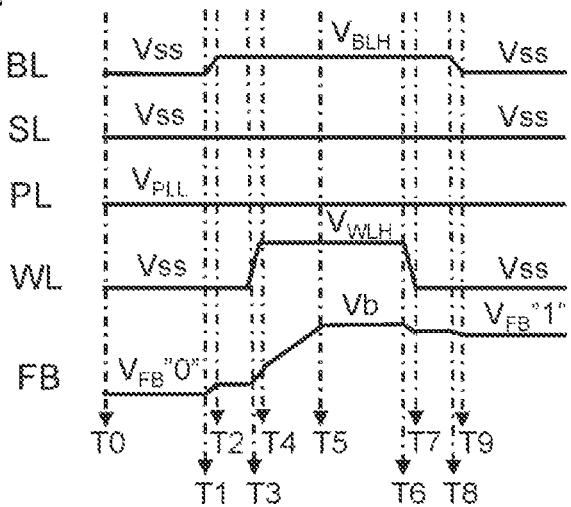
Figure 2A:
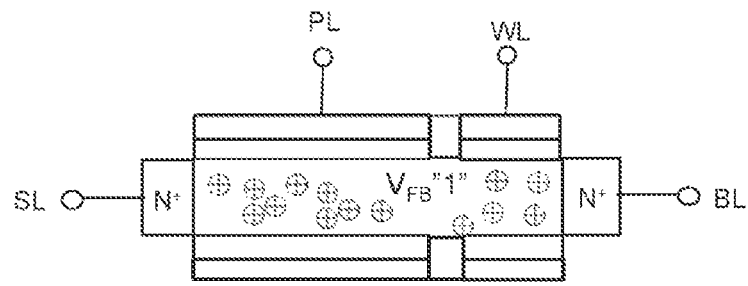
Figure 2B:
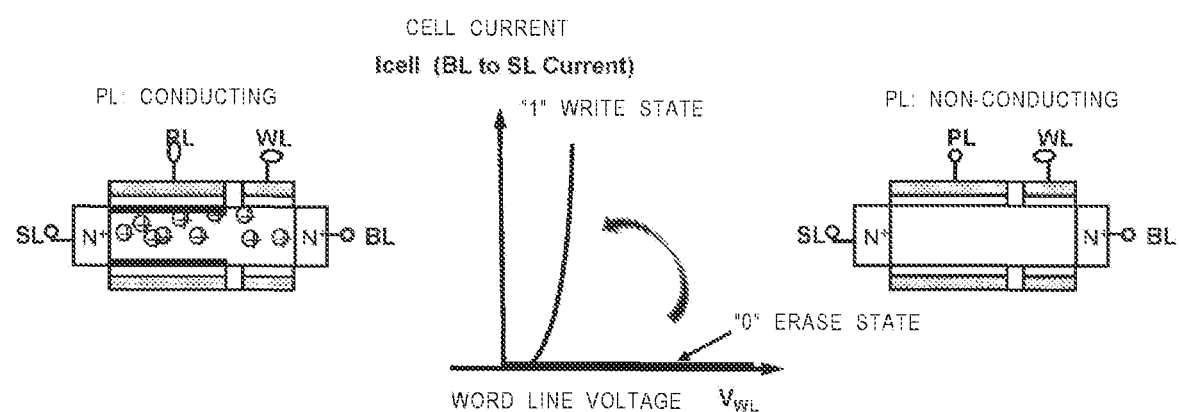
FIG. 2B includes diagrams for explaining the mechanism of the page write operation of the memory device according to the first embodiment.

FIGS. 2AA to 2AC and FIG. 2B illustrate a page write operation (which is an example of "page write operation" in the claims) of the dynamic flash memory cell according to the first embodiment of the present invention. FIG. 2AA illustrates a mechanism of the write operation, and FIG. 2AB illustrates operation waveforms of the bit line BL, the source line SL, the plate line PL, the word line WL, and the semiconductor body 7 that functions as a floating body FB. At time T0, the dynamic flash memory cell is in a "0" erase state, and the voltage of the semiconductor body 7 is equal to $V_{FB}$"0". Vss is applied to the bit line BL, the source line SL, and the word line WL, and V $P_{LL}$ is applied to the plate line PL. Here, for example, Vss is equal to 0 V and V $P_{LL}$ is equal to 2 V. Subsequently, from time T1 to time T2, when the bit line BL rises from Vss to $V_{BLH}$, in a case where, for example, Vss is equal to 0 V, the voltage of the semiconductor body 7 becomes equal to $V_{FB}$"0"+$\beta_{BL} \times V_{BLH}$ due to capacitive coupling between the bit line BL and the semiconductor body 7.

The description of the write operation of the dynamic flash memory cell will be continued with reference to FIGS. 2AA and 2AB. From time T3 to time T4, the word line WL rises from Vss to $V_{WLH}$. Accordingly, when the threshold voltage in "0" erase of a second N-channel MOS transistor region that is a region in which the second gate conductor layer 5b to which the word line WL is connected surrounds the semiconductor body 7 is denoted by $Vt_{WL}$"0", as the voltage of the word line WL rises, in a range from Vss to $Vt_{WL}$"0", the voltage of the semiconductor body 7 becomes equal to $V_{FB}$"0"+$\beta_{BL} \times V_{BLH}$+$\beta_{WL} \times Vt_{WL}$"0" due to second capacitive coupling between the word line WL and the semiconductor body 7. When the voltage of the word line WL rises to $Vt_{WL}$"0" or above, an inversion layer 12b in a ring form is formed in the semiconductor body 7 on the inner periphery of the second gate conductor layer 5b and interrupts the second capacitive coupling between the word line WL and the semiconductor body 7.

The description of the write operation of the dynamic flash memory cell will be continued with reference to FIGS. 2AA and 2AB. From time T3 to time T4, for example, a fixed voltage $V_{PLL}$=2 V is applied to the first gate conductor layer 5a to which the plate line PL is connected, and the second gate conductor layer 5b to which the word line WL is connected is increased to, for example, $V_{WLH}$=4 V. As a result, as illustrated in FIG. 2AA, an inversion layer 12a in a ring form is formed in the semiconductor body 7 on the inner periphery of the first gate conductor layer to which the plate line PL is connected, and a pinch-off point 13 is present in the inversion layer 12a. As a result, a first N-channel MOS transistor region including the first gate conductor layer 5a operates in the saturation region. In contrast, the second N-channel MOS transistor region including the second gate conductor layer 5b to which the word line WL is connected operates in the linear region. As a result, a pinch-off point is not present in the semiconductor body 7 on the inner periphery of the second gate conductor layer 5b to which the word line WL is connected, and the inversion layer 12b is formed on the entire inner periphery of the second gate conductor layer 5b. The inversion layer 12b that is formed on the entire inner periphery of the second gate conductor layer 5b to which the word line WL is connected substantially functions as the drain of the first N-channel MOS transistor region. As a result, the electric field becomes maximum in a first boundary region of the semiconductor body 7 between the first N-channel MOS transistor region including the first gate conductor layer 5a and the second N-channel MOS transistor region including the second gate conductor layer that are connected in series, and an impact ionization phenomenon occurs in this region. This region is a source-side region when viewed from the second N-channel MOS transistor region including the second gate conductor layer to which the word line WL is connected, and therefore, this phenomenon is called a source-side impact ionization phenomenon. By this source-side impact ionization phenomenon, electrons flow from the N⁺ layer 3a to which the source line SL is connected toward the N⁺ layer 3b to which the bit line is connected. The accelerated electrons collide with lattice Si atoms, and electron-positive hole pairs are generated by the kinetic energy. Although some of the generated electrons flow into the first gate conductor layer 5a and into the second gate conductor layer 5b, most of the generated electrons flow into the N⁺ layer 3b to which the bit line BL is connected (not illustrated).

As illustrated in FIG. 2AC, a generated group of positive holes 9 (which is an example of "group of positive holes" in the claims) are majority carriers in the semiconductor body 7, with which the semiconductor body 7 is charged to a positive bias. The N⁺ layer 3a to which the source line SL is connected is at 0 V, and therefore, the semiconductor body 7 is charged up to the built-in voltage Vb (about 0.7 V) of the PN junction between the N⁺ layer 3a to which the source line SL is connected and the semiconductor body 7. When the semiconductor body 7 is charged to a positive bias, the threshold voltages of the first N-channel MOS transistor region and the second N-channel MOS transistor region decrease due to a substrate bias effect.

The description of the write operation of the dynamic flash memory cell will be continued with reference to FIG. 2AB. From time T6 to time T7, the voltage of the word line WL drops from $V_{WLH}$ to Vss. During this period, although the second capacitive coupling is formed between the word line WL and the semiconductor body 7, the inversion layer 12b interrupts the second capacitive coupling until the voltage of the word line WL drops from $V_{WLH}$ to a threshold voltage $Vt_{WL}$"1" of the second N-channel MOS transistor region or below when the voltage of the semiconductor body 7 is equal to Vb. Therefore, the capacitive coupling between the word line WL and the semiconductor body 7 is substantially formed only during a period from when the word line WL drops to $Vt_{WL}$"1" or below to when the word line WL drops to Vss. As a result, the voltage of the semiconductor body 7 becomes equal to Vb−$\beta_{WL}$×$Vt_{WL}$"1". Here, $Vt_{WL}$"1" is lower than $Vt_{WL}$"0" described above, and the change $\beta_{WL}$×$Vt_{WL}$"1" in the voltage of the semiconductor body 7 is reduced so as to be small.

The description of the page write operation of the dynamic flash memory cell will be continued with reference to FIG. 2AB. From time T8 to time T9, the bit line BL drops from $V_{BLH}$ to Vss. The bit line BL and the semiconductor body 7 are capacitively coupled with each other, and therefore, the "1" write voltage $V_{FB}$"1" of the semiconductor body 7 becomes as follows at the end.

$$V_{FB}\text{"1"}=Vb-\beta_{WL}\times Vt_{WL}\text{"1"}-\beta_{BL}\times V_{BLH} \quad (1)$$

Here, the coupling ratio $\beta_{BL}$ between the bit line BL and the semiconductor body 7 is also small. Accordingly, as illustrated in FIG. 2B, the threshold voltage of the second N-channel MOS transistor region of the second semiconductor body 7b to which the word line WL is connected decreases. The memory write operation in which the voltage $V_{FB}$"1" in the "1" write state of the semiconductor body 7 is assumed to be a first data retention voltage (which is an example of "first data retention voltage" in the claims) is performed to assign logical storage data "1". In the "0" erase state of the semiconductor body 7, the threshold voltage of the first N-channel MOS transistor region of the first semiconductor body 7a to which the plate line PL is connected and that of the second N-channel MOS transistor region of the second semiconductor body 7b to which the word line WL is connected increase, and therefore, when the voltage applied to the plate line PL is set to the threshold voltage or below, a cell current Icell does not flow even when the voltage of the word line WL is increased.

At the time of the write operation, electron-positive hole pairs may be generated by an impact ionization phenomenon in a second boundary region between the first impurity region 3a and the first semiconductor body 7a or in a third boundary region between the second impurity region 3b and the second semiconductor body 7b instead of the first boundary region, and the semiconductor body 7 may be charged with the generated group of positive holes 9.

Note that the conditions of voltages applied to the bit line BL, the source line SL, the word line WL, and the plate line PL and the potential of the floating body described above are examples for performing the write operation, and other operation conditions based on which electron-positive hole pairs are generated by an impact ionization phenomenon may be employed.

Figure 3A:
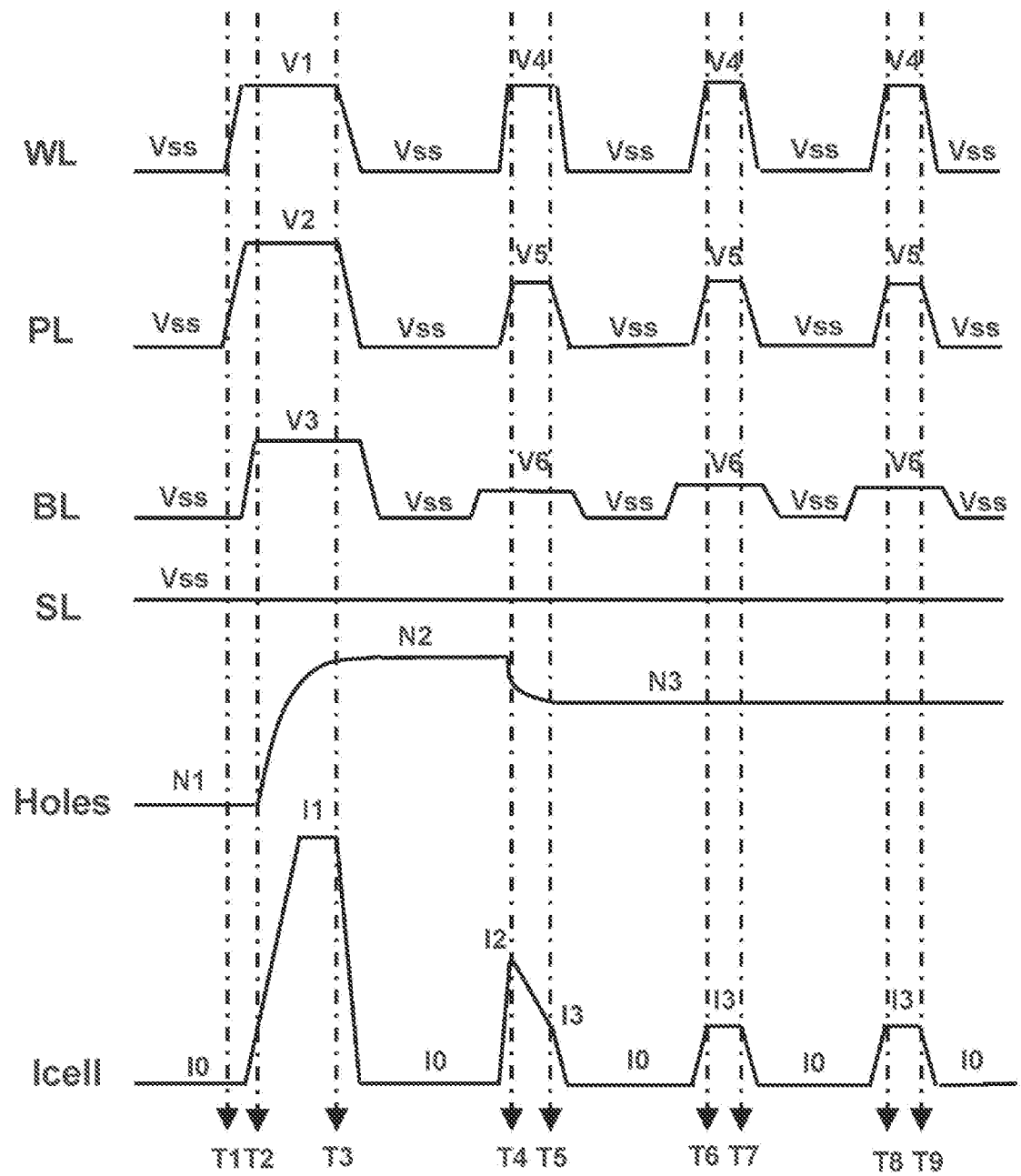
FIG. 3A is a diagram for explaining a page write post-processing operation of the memory device according to the first embodiment.
Figure 3B:
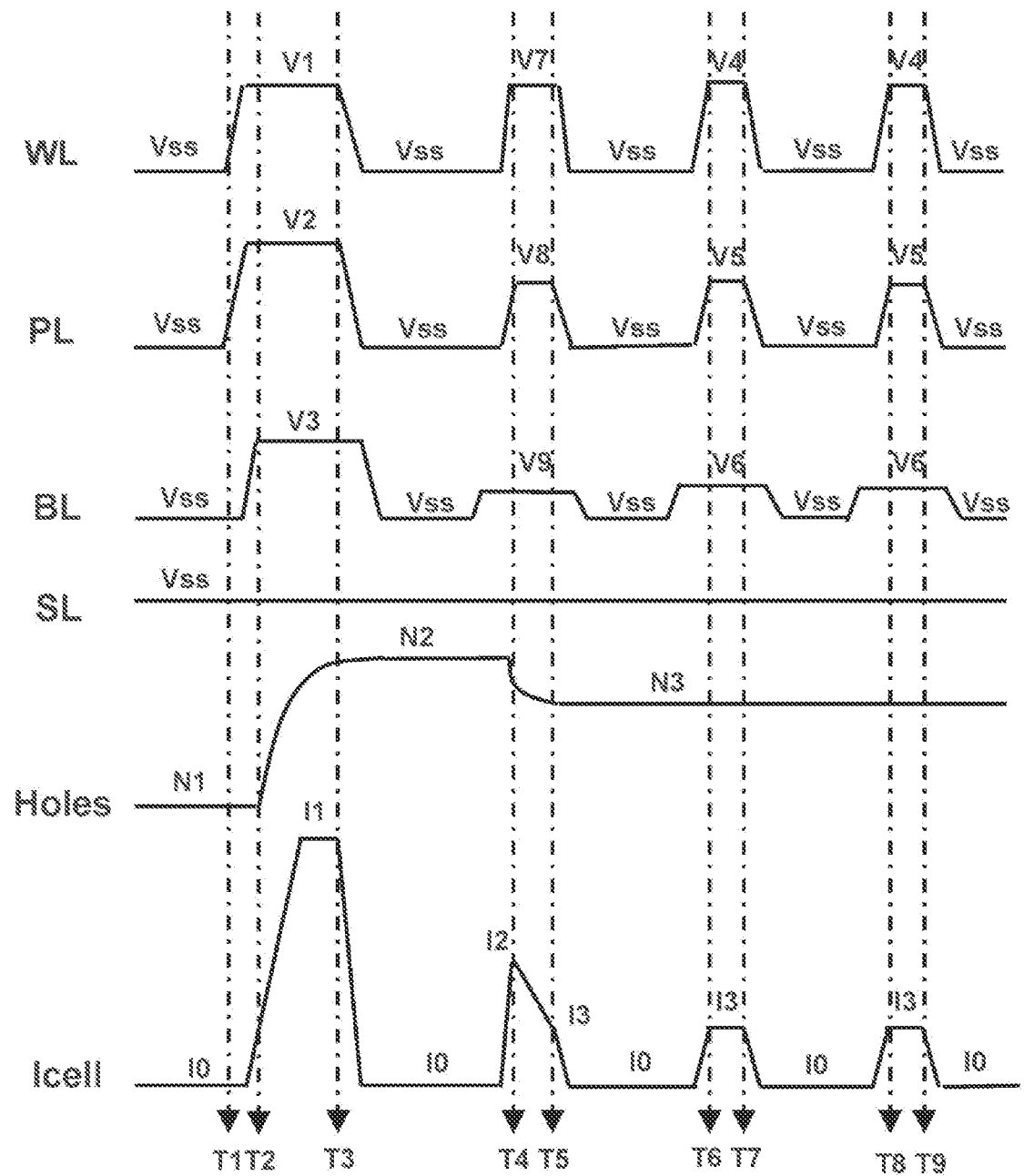
FIG. 3B is a diagram for explaining the page write post-processing operation of the memory device according to the first embodiment.
Figure 3C:
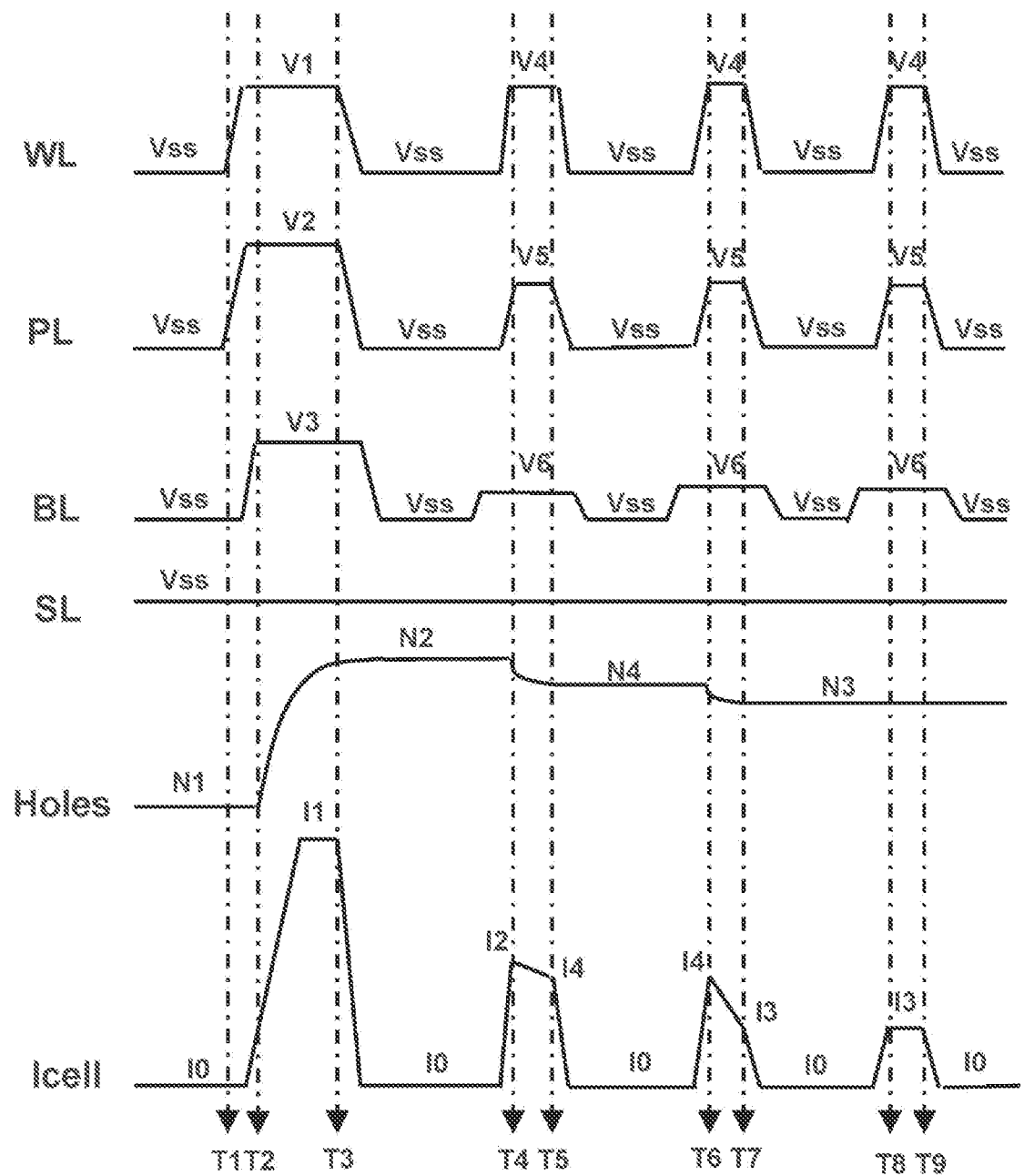
FIG. 3C is a diagram for explaining the page write post-processing operation of the memory device according to the first embodiment.

FIG. 3A to FIG. 3C illustrate a page write post-processing operation (which is an example of "page write post-processing operation" in the claims) performed after the page write operation of the dynamic flash memory cell according to the first embodiment of the present invention.

FIG. 3A illustrates operation waveforms of the word line WL, the plate line PL, the bit line BL, and the source line SL, the number of holes in the group of positive holes 9 stored in the semiconductor body 7, and the memory cell current Icell in the page write post-processing operation performed after the page write operation of the dynamic flash memory cell. At time T1, the word line WL and the plate line PL are selected, a first voltage V1 is applied to the word line WL, a second voltage V2 is applied to the plate line PL, and the page write operation starts. At time T2, a third voltage V3 is applied to the bit line BL connected to a memory cell, in a selected page (which is an example of "page" in the claims), to which logical "1" is to be written. Here, the first voltage V1, the second voltage V2, and the third voltage V3 are equal to, for example, 1.5 V, 1.3 V, and 1.0 V respectively. As a result, an impact ionization phenomenon occurs in the semiconductor body 7 in a part near an intermediate layer between the word line WL and the plate line PL and electron-positive hole pairs are generated. At this time, the generated group of electrons flow into the bit line BL, and the generated group of positive holes 9 are stored in the semiconductor body 7. Accordingly, the voltage of the semiconductor body 7 rises, and with this substrate bias effect, the threshold voltages of the MOS transistor regions of the word line WL and the plate line PL drop. Therefore, positive feedback occurs and the number of holes Holes in the group of positive holes 9 increases from N1 in a neutral state to N2 at time T3, which is a first time (which is an example of "first time" in the claims). The memory cell current Icell increases from I0 to I1. Thereafter, the word line WL, the plate line PL, and the bit line BL return to, for example, a ground voltage Vss, and the operation of storing the group of positive holes 9 in the semiconductor body 7 in the page write operation temporarily ends.

At time T4, which is a second time (which is an example of "second time" in the claims), the page write post-processing operation of making a group of excess positive holes (which is an example of "group of excess positive holes" in the claims) among the group of positive holes 9 that are stored in the semiconductor body 7 in the page write operation disappear is performed. In the page write post-processing operation, pulse voltages are applied to the word line WL, the plate line PL, and the bit line BL. The applied voltages rise from the ground voltage Vss to, for example, a fourth voltage V4, a fifth voltage V5, and a sixth voltage V6. The fourth voltage V4, the fifth voltage V5, and the sixth voltage V6 may be identical to, for example, voltages applied in a page read operation. As a result, the group of excess positive holes disappear, the number of holes Holes in the group of positive holes 9 decreases from N2 to N3, and the memory cell current Icell decreases from I2 to I3. The dynamic flash memory cell is required to perform a stable page write operation and prevent a malfunction of a sense amplifier circuit. For this, a stable memory cell current Icell needs to be read by a sense amplifier circuit SA (which is an example of "sense amplifier circuit" in the claims) illustrated in FIG. 4E. Therefore, even when a page read operation is performed from time T6 to time T7 and from time T8 to time T9, the number of holes Holes in the group of positive holes 9 remains equal to N3, the memory cell current Icell is kept at a constant value I3, and the page read operation can be stably performed. In this example, the period from time T1 to time T5 is a period in which the series of page write operations is performed.

FIG. 3B illustrates an example where the voltages applied to the word line WL, the plate line PL, and the bit line BL in the page write post-processing operation are increased from the ground voltage Vss to, for example, a seventh voltage V7, an eighth voltage V8, and a ninth voltage V9 respectively. The seventh voltage V7, the eighth voltage V8, and the ninth voltage V9 are higher than the fourth voltage V4, the fifth voltage V5, and the sixth voltage V6 applied in the page read operation performed after the page write post-processing operation illustrated in FIG. 3A. Therefore, the group of excess positive holes can be made to efficiently disappear.

FIG. 3C illustrates an example where the voltages applied to the word line WL, the plate line PL, and the bit line BL in the page write post-processing operation are respectively set to the fourth voltage V4, the fifth voltage V5, and the sixth voltage V6 that are identical to the voltages applied in the page read operation and where pulse voltages are applied twice. From time T4 to time T5, the number of holes Holes in the group of positive holes 9 decreases from N2 to N4, and the memory cell current Icell decreases from I2 to I4. From time T6 to time T7, the number of holes Holes in the group of positive holes 9 decreases from N4 to N3, and the memory cell current Icell decreases from I4 to I3. Accordingly, abrupt disappearing of the group of excess positive holes can be prevented. In this example, the period from time T1 to T7 is a period in which the series of page write operations is performed.

A mechanism of a page erase operation (which is an example of "page erase operation" in the claims) will be described with reference to FIG. 4A to FIG. 4E.

Figure 4A:
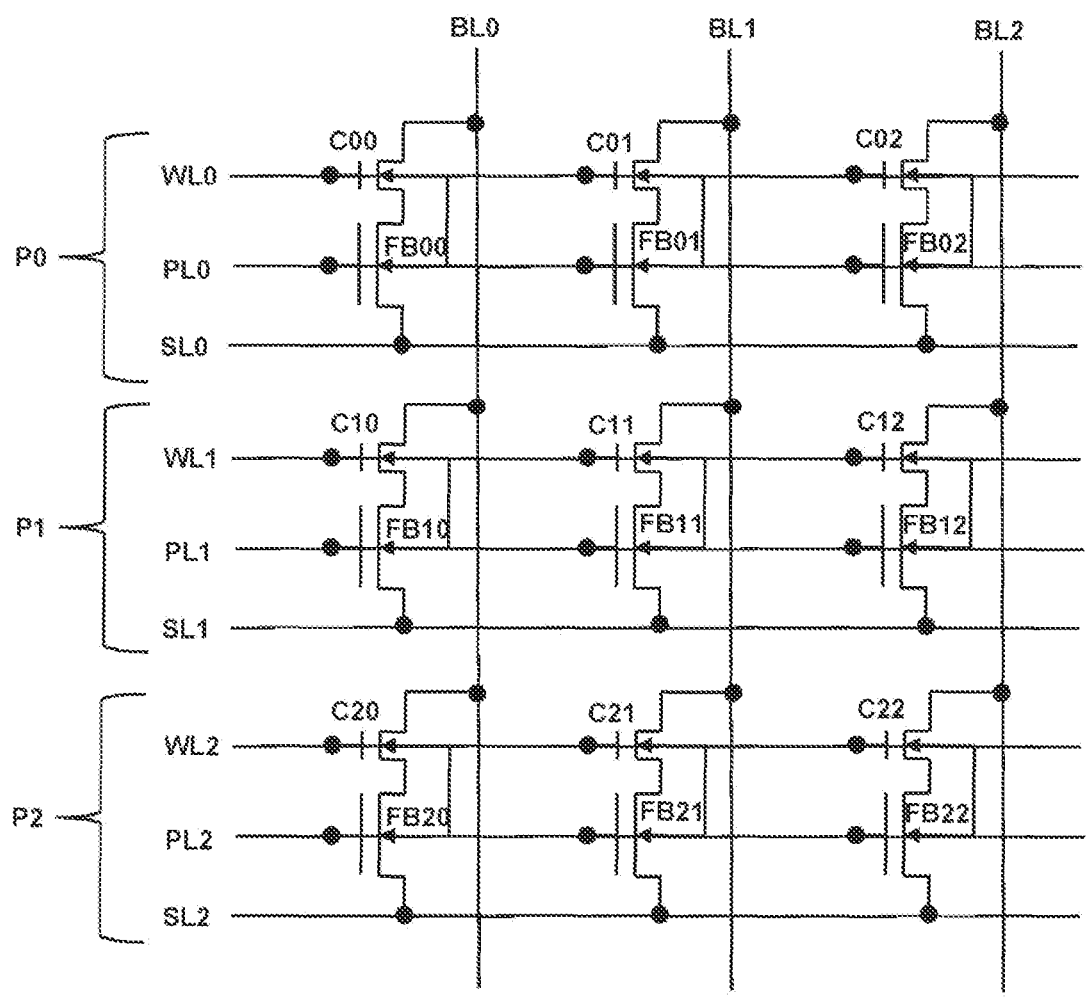
FIG. 4A is a diagram for explaining a mechanism of a page erase operation of the memory device according to the first embodiment.

FIG. 4A is a circuit diagram of a memory block for explaining the page erase operation. Although nine memory cells C00 to C22 in three rows and three columns in plan view are illustrated, the actual memory block is larger than this matrix. When memory cells are arranged in a matrix, one of the directions of the arrangement is called "row direction" (or "in rows") and the direction perpendicular to the one of the directions is called "column direction" (or "in columns"). To each of the memory cells, a corresponding one of the source lines SL0 to SL2, a corresponding one of the bit lines BL0 to BL2, a corresponding one of the plate lines PL0 to PL2, and a corresponding one of the word lines WL0 to WL2 are connected. The source lines SL0 to SL2, the plate lines PL0 to PL2, and the word lines WL0 to WL2 are disposed in parallel, and the bit lines BL0 to BL2 are disposed in a direction perpendicular to the source lines SL0 to SL2, the plate lines PL0 to PL2, and the word lines WL0 to WL2. For example, it is assumed that the memory cells C10 to C12, in a specific page P1, to which the plate line PL1, the word line WL1, and the source line SL1 are connected are selected in this block and the page erase operation is performed.

FIG. 4B is an operation waveform diagram of the page erase operation. A case where the page erase operation starts and, for example, selective erasing for the page P1 is performed will be described. At a first time T1, the word line WL1 and the plate line PL1 rise from the ground voltage Vss to a first voltage V1 and a second voltage V2 respectively. Here, the ground voltage Vss is equal to, for example, 0 V. The first voltage V1 and the second voltage V2 are equal to, for example, 1 V. Next, at a second time T2, the source line SL1 drops from the ground voltage Vss to a third voltage V3. Here, the third voltage V3 is a negative voltage and is equal to, for example, −1 V. As a result, the PN junction between the first impurity region 3*a*, which is an $N^+$ layer, and the semiconductor body 7, which is a P layer, are forward biased, and the group of positive holes 9 stored in the semiconductor body 7 are discharged to the first impurity region 3*a*. When the discharge of the group of positive holes 9 stored in the semiconductor body 7 reaches saturation, the source line SL1 returns from the third voltage V3 to the ground voltage Vss at a third time T3, the word line WL1 and the plate line PL1 respectively return from the first voltage V1 and the second voltage V2 to the ground voltage Vss at a fourth time T4, and the page erase operation ends. The page erase operation in which the voltage $V_{FB}$ "0" in the "0" erase state of the semiconductor body 7 is assumed to be a second data retention voltage (which is an example of "second data retention voltage" in the claims) is performed to assign logical storage data "0".

Note that one of the word line WL1 or the plate line PL1 may rise from the ground voltage Vss to the first voltage V1 or the second voltage V2 before or after the first time T1. The source line SL1 may drop from the ground voltage Vss to the third voltage V3 before the first time T1. One of the word line WL1 or the plate line PL1 may return from the first voltage V1 or the second voltage V2 to the ground voltage Vss before or after the fourth time T4. The source line SL1 may return from the third voltage V3 to the ground voltage Vss after the fourth time T4.

Further, when the source line SL1 drops from the ground voltage Vss to the third voltage V3 at the second time T2, a current flows to the source line SL1 from the bit lines BL0 to BL2. As a result, an impact ionization phenomenon occurs in the semiconductor body 7, which is a P layer, in a part near the second impurity region 3*b*, which is an $N^+$ layer, and electron-positive hole pairs are generated. At this time, the group of positive holes 9 that are generated in the semiconductor body 7 and the group of positive holes 9 that are discharged to the first impurity region 3*a* are in balance, which is a saturation state, and the page erase operation ends.

Figure 4C:
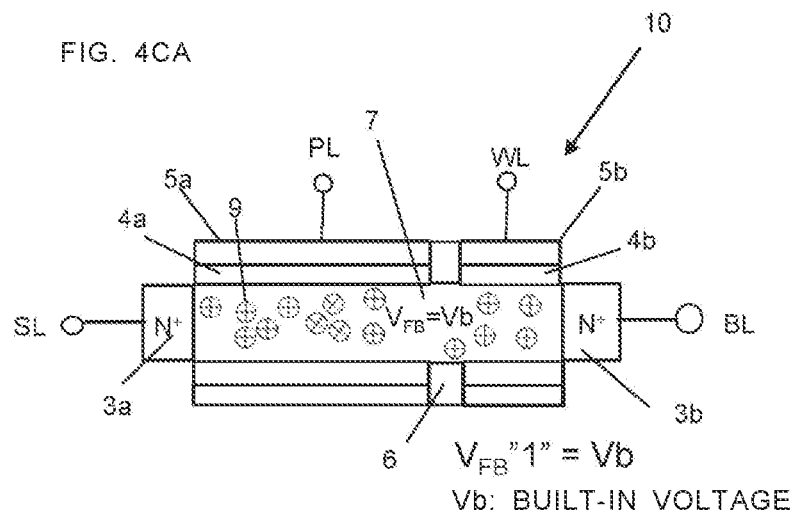
FIGS. 4CA, 4CB and 4CC are diagrams for explaining the mechanism of the page erase operation of the memory device according to the first embodiment.
Figure 4C:
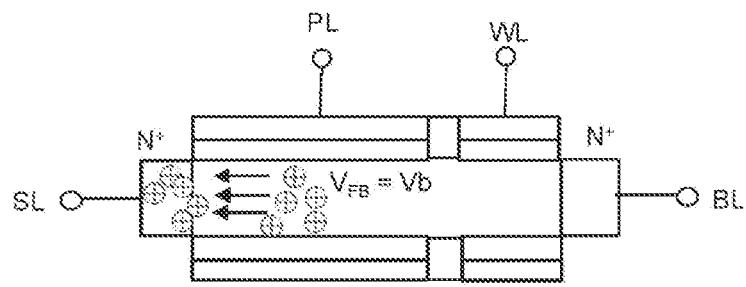
Figure 4C:
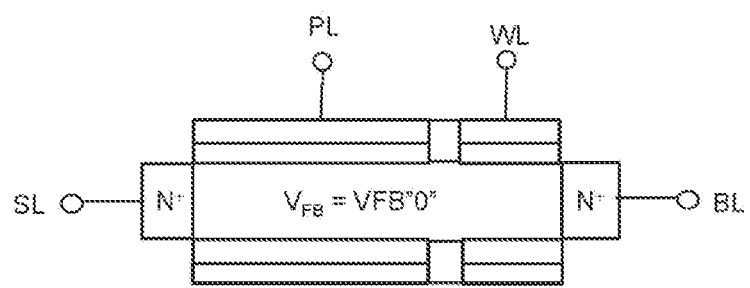

The state of the semiconductor body during the erase operation will be described with reference to FIGS. 4CA to 4CC. FIG. 4CA illustrates a state before the erase operation, in which the group of positive holes 9 generated by impact ionization are stored in the semiconductor body 7. When the page erase operation starts, the PN junction between the source N+ layer 3a and the semiconductor body 7 enters a forward bias state and the group of positive holes 9 in the semiconductor body 7 are discharged to the source N+ layer 3a as illustrated in FIG. 4CB. As a result, the voltage $V_{FB}$ of the semiconductor body 7 becomes equal to the built-in voltage Vb of the PN junction formed by the source N+ layer 3a and the P-layer semiconductor body 7.

Subsequently, when the word line WL and the plate line PL for selective erasing returns from the first voltage V1 and the second voltage V2 to the ground voltage Vss, the voltage $V_{FB}$ of the semiconductor body 7 changes from Vb to $V_{FB}$"0" due to capacitive coupling between the word line WL and the semiconductor body 7 and between the plate line PL and the semiconductor body 7. This state is illustrated in FIG. 4CC.

Note that the conditions of voltages applied to the bit line BL, the source line SL, the word line WL, and the plate line PL and the potential of the floating body described above are examples for performing the page erase operation, and other operation conditions based on which the page erase operation can be performed may be employed.

Figure 4D:
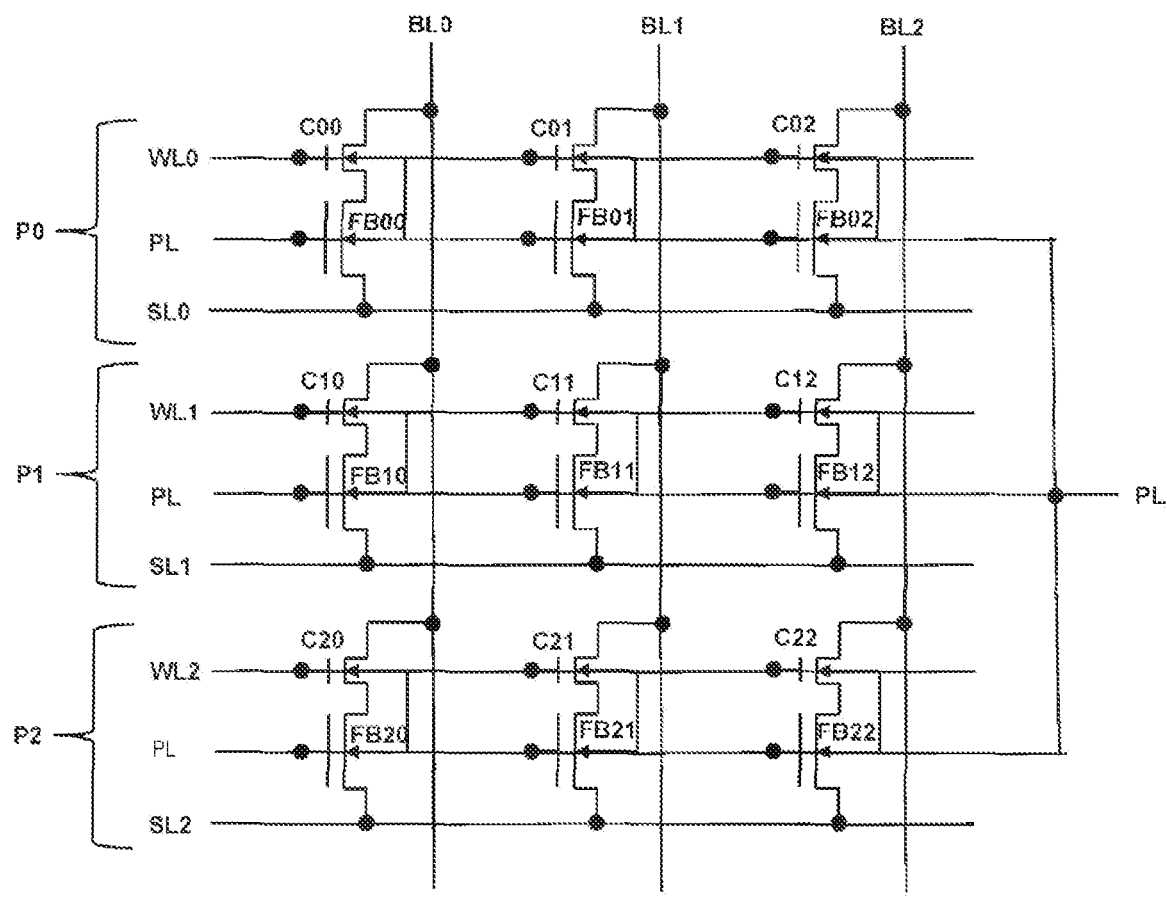
FIG. 4D is a diagram for explaining the mechanism of the page erase operation of the memory device according to the first embodiment.

FIG. 4D is a circuit diagram of a memory block in a case where the plate line PL is disposed so as to be shared between at least two or more pages adjacent to each other. The plate line PL of three pages P0 to P2 is shared.

Figure 4E:
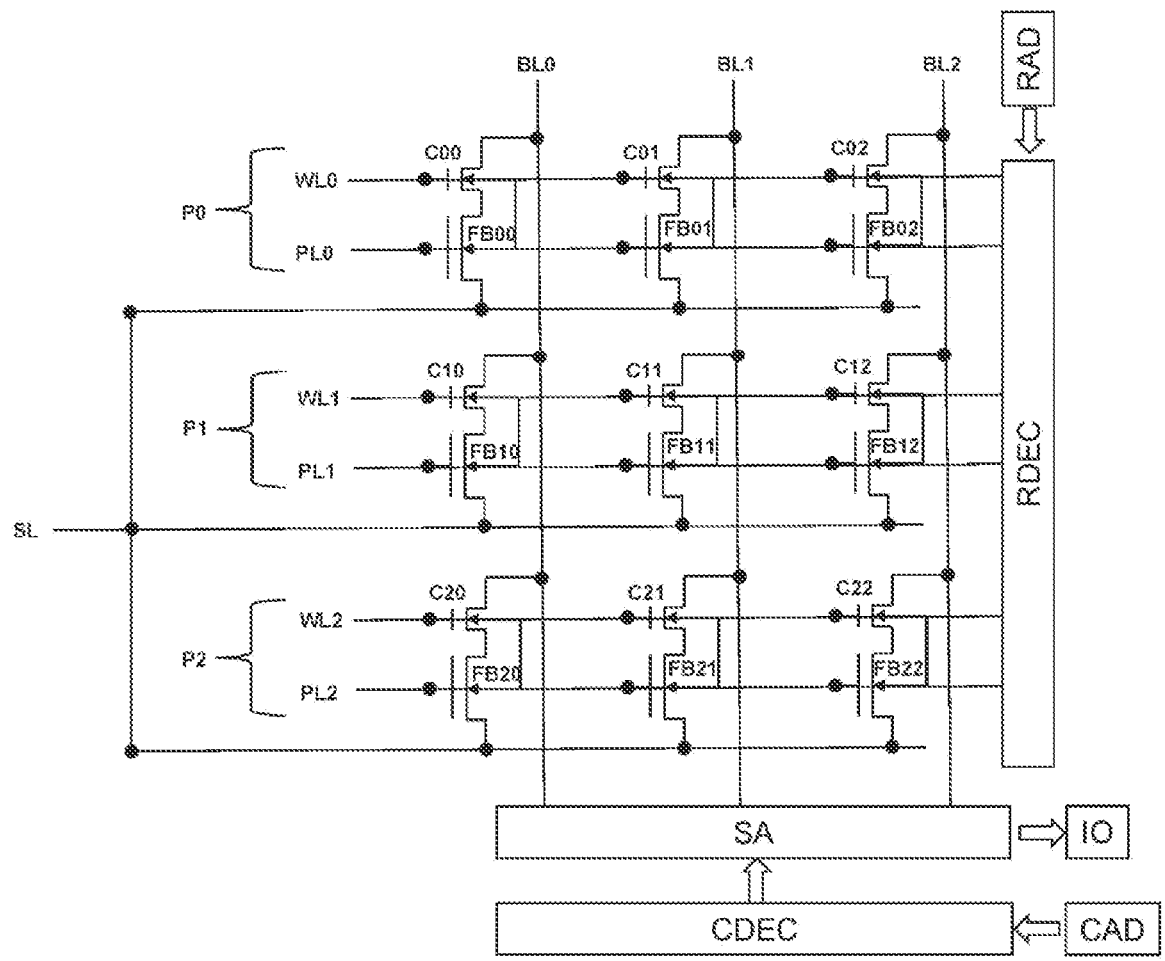
FIG. 4E is a diagram for explaining the mechanism of the page erase operation of the memory device according to the first embodiment.
Figure 5A:
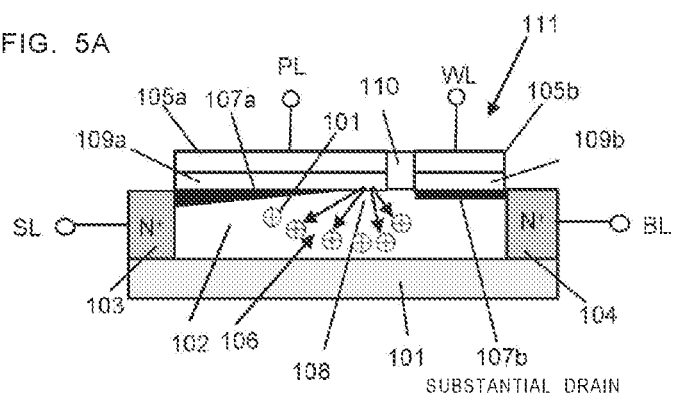
FIGS. 5A, 5B, 5C and 5D are diagrams for explaining a dynamic flash memory in the related art.
Figure 5B:
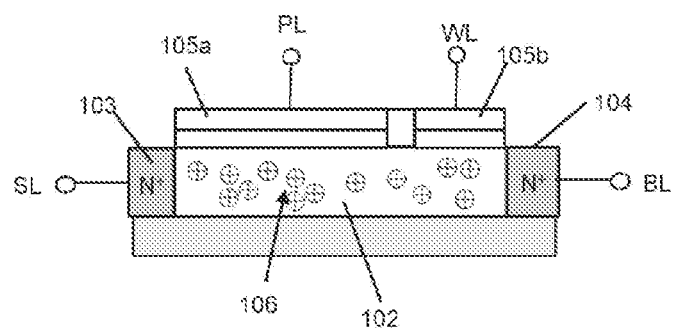
Figure 5C:
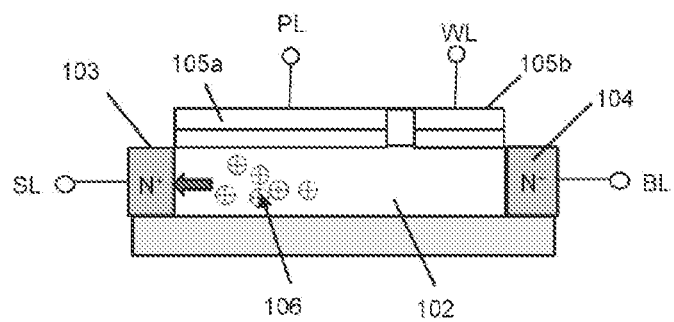
Figure 5D:
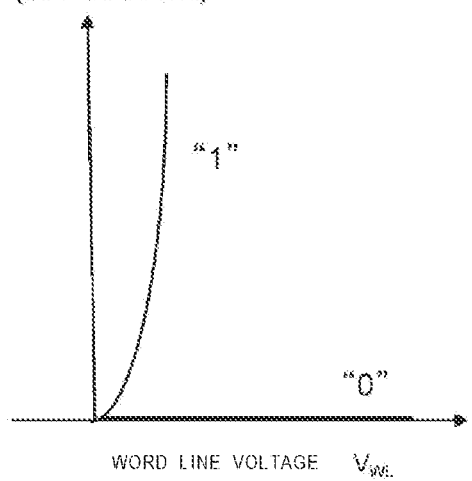

FIG. 4E is a diagram of a memory block including main circuits. The word lines WL0 to WL2 and the plate lines PL0 to PL2 are connected to a row decoder circuit RDEC (which is an example of "row decoder circuit" in the claims), the row decoder circuit receives a row address RAD (which is an example of "row address" in the claims), and selection from the pages P0 to P2 is made in accordance with the row address RAD. The bit lines BL0 to BL2 are connected to the sense amplifier circuit SA, the sense amplifier circuit SA is connected to a column decoder circuit CDEC (which is an example of "column decoder circuit" in the claims), the column decoder circuit CDEC receives a column address CAD (which is an example of "column address" in the claims), and the sense amplifier circuit SA is selectively connected to an input/output circuit IO (which is an example of "input/output circuit" in the claims) in accordance with the column address CAD.

Note that driving performed in a case where each of the first gate conductor layer 7a and the second gate conductor layer 7b illustrated in FIG. 1 is constituted by one gate conductor layer has been described with reference to FIGS. 2AA to 2AC to FIG. 4E. In contrast, in a case where one of the first gate conductor layer 5a or the second gate conductor layer 5b is divided into two gate conductor layers and the divided two gate conductor layers are disposed on the respective sides of the first gate conductor layer 5a or the second gate conductor layer 5b that is not divided, the voltages illustrated in FIGS. 2AA to 2AC to FIG. 4E are applied to at least one of the divided two gate conductor layers. Accordingly, the operations of the dynamic flash memory cell are normally performed.

Regardless of whether the horizontal cross-sectional shape of the Si column 2 illustrated in FIG. 1 is a round shape, an elliptic shape, or a rectangular shape, the operations of the dynamic flash memory described in this embodiment can be performed. Further, a dynamic flash memory cell having a round shape, a dynamic flash memory cell having an elliptic shape, and a dynamic flash memory cell having a rectangular shape may coexist on the same chip.

With reference to FIG. 1, the dynamic flash memory element including, for example, an SGT in which the first gate insulator layer 4a and the second gate insulator layer 4b that surround the entire side surface of the Si column 2 standing on the substrate in the vertical direction are provided and which includes the first gate conductor layer and the second gate conductor layer 5b that entirely surround the first gate insulator layer 4a and the second gate insulator layer 4b has been described. As indicated in the description of this embodiment, the dynamic flash memory element needs to have a structure that satisfies the condition that the group of positive holes 9 generated by an impact ionization phenomenon are retained in the semiconductor body 7. For this, the semiconductor body 7 needs to have a floating body structure isolated from the substrate. Accordingly, even when the semiconductor body is formed horizontally along the substrate (such that the central axis of the semiconductor body is parallel to the substrate) by using, for example, GAA (Gate All Around, see, for example, J. Y. Song, W. Y. Choi, J. H. Park, J. D. Lee, and B-G. Park: "Design Optimization of Gate-All-Around (GAA) MOSFETs", IEEE Trans. Electron Devices, vol. 5, no. 3, pp. 186-191, (2006)) technology, which is one type of SGT, or nanosheet technology (see, for example, N. Loubet, et al.: "Stacked Nanosheet Gate-All-Around Transistor to Enable Scaling Beyond FinFET", 2017 IEEE Symposium on VLSI Technology Digest of Technical Papers, T17-5, T230-T231, (2017)), the above-described operations of the dynamic flash memory can be performed. The dynamic flash memory element may have a structure in which a plurality of GAA transistors or nanosheets formed in the horizontal direction are stacked. Alternatively, the dynamic flash memory element may have a device structure using SOI (Silicon On Insulator) (see, for example, J. Wan, L. Rojer, A. Zaslaysky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida: "A Capacitorless 1T-DRAM Technology Using Gate-Induced Drain Leakage (GIDL) Current for Low-Power and High-Speed Embedded Memory", IEEE IEDM (2006)). In this device structure, the bottom portion of the semiconductor body is in contact with an insulating layer of the SOI substrate, and the other portion of the semiconductor body is surrounded by a gate insulator layer and an element isolation insulating layer. With such a structure, the semiconductor body also has a floating body structure. Accordingly, the dynamic flash memory element provided in this embodiment needs to satisfy the condition that the semiconductor body has a floating body structure. Even with a structure in which a Fin transistor (see, for example, H. Jiang, N. Xu, B. Chen, L. Zengl, Y. He, G. Du, X. Liu and X. Zhang: "Experimental investigation of self-heating effect (SHE) in multiple-fin SOI FinFETs", Semicond. Sci. Technol. 29 115021 pp. 7 (2014)) is formed on an SOI substrate, as long as the semiconductor body has a floating body structure, the operations of the dynamic flash memory can be performed.

Although the reset voltages of the word line WL, the bit line BL, and the source line SL are specified as Vss in the descriptions of FIGS. 2AA to 2AC and FIG. 2B, the reset voltages of the respective lines may be set to different voltages.

Although FIG. 4A to FIG. 4E and the descriptions thereof illustrate example conditions of the page erase operation, the voltages applied to the source line SL, the plate line PL, the bit line BL, and the word line WL may be changed as long as a state in which the group of positive holes 9 in the semiconductor body 7 are discharged through one or both of the N+ layer 3a and the N+ layer 3b can be attained. Further, in the page erase operation, a voltage may be applied to the source line SL of a selected page, and the bit line BL may be put in a floating state. In the page erase operation, a voltage may be applied to the bit line BL of a selected page, and the source line SL may be put in a floating state.

In FIG. 1, in a direction perpendicular to the substrate, in a part of the semiconductor body 7 surrounded by the insulating layer 6, the potential distribution of the first semiconductor body 7a and that of the second semiconductor body 7b are connected and formed. Accordingly, the first semiconductor body 7a and the second semiconductor body 7b that constitute the semiconductor body 7 are connected in the vertical direction in the region surrounded by the insulating layer 6.

Further, in FIG. 1, it is desirable to make the length of the first gate conductor layer 5a, in the vertical direction, to which the plate line PL is connected further longer than the length of the second gate conductor layer in the vertical direction, to which the word line WL is connected to attain $C_{PL} > C_{WL}$. However, when the plate line PL is only added, the capacitive coupling ratio ($C_{WL}/(C_{PL}+C_{WL}+C_{BL}+C_{SL})$) of the word line WL to the semiconductor body 7 decreases. As a result, the potential change $\Delta V_{FB}$ of the semiconductor body 7 that is a floating body decreases.

Further, in the specification, the meaning of "cover" in a case of "a gate insulator layer, a gate conductor layer, or the like covers a channel or the like" also includes a case of surrounding entirely as in an SGT or GAA, a case of surrounding except a portion as in a Fin transistor, and a case of being in contact partially or entirely with the side surface of a gate insulator layer such as a case of overlapping a flat object as in a planar transistor.

Further, although the first gate conductor layer entirely surrounds the first gate insulator layer 4a in FIG. 1, a structure may be employed in which the first gate conductor layer 5a partially surrounds the first gate insulator layer 4a in plan view. The first gate conductor layer 5a may be divided into at least two gate conductor layers, and the gate conductor layers may each be operated as an electrode of the plate line PL. Similarly, the second gate conductor layer 5b may be divided into two or more gate conductor layers, and the gate conductor layers may each function as a conductive electrode of the word line and may be operated synchronously or asynchronously. In this case, the operations of the dynamic flash memory can be performed.

In FIG. 1, the first gate conductor layer 5a may be connected to the word line WL and the second gate conductor layer 5b may be connected to the plate line PL. In this case, the above-described operations of the dynamic flash memory can also be performed.

This embodiment has the following feature.

Feature

A feature of the dynamic flash memory cell according to the first embodiment of the present invention is the page write operation. In the present invention, in the page write operation, the group of positive holes 9 are generated inside the semiconductor body 7 excessively, but with certainty, by an impact ionization phenomenon at the first time T3, and the page write post-processing operation of making a group of excess positive holes disappear is subsequently performed at the second time T4. This can allow stable page reading. That is, with the page write post-processing operation, a stable memory cell current Icell is obtained, and correct data can be read by the sense amplifier circuit SA. Even when the page read operation is performed a plurality of times after the page write post-processing operation, the number of positive holes in the semiconductor body 7 does not change, the memory cell current for logical "1" data is kept at a constant value, the page read operation can be stably performed, and a highly reliable memory device can be provided.

Other Embodiments

Although the Si column is formed in the present invention, a semiconductor column made of a semiconductor material other than Si may be formed. The same applies to other embodiments according to the present invention.

To write "1", electron-positive hole pairs may be generated by an impact ionization phenomenon using a gate-induced drain leakage (GIDL) current described in E. Yoshida: "A Capacitorless 1T-DRAM Technology Using Gate-Induced Drain Leakage (GIDL) Current for Low-Power and High-Speed Embedded Memory", IEEE IEDM (2006), and the floating body FB may be filled with the generated group of positive holes. The same applies to other embodiments according to the present invention.

Even with a structure in which the polarity of the conductivity type of each of the N+ layers 3a and 3b and the P-layer Si column 2 in FIG. 1 is reversed, the operations of the dynamic flash memory can be performed. In this case, in the Si column 2 that is of N-type, the majority carriers are electrons. Therefore, a group of electrons generated by impact ionization are stored in the semiconductor body 7, and a "1" state is set.

The Si columns of the memory cells may be arranged in two dimensions in a square lattice or in a diagonal lattice to form a memory block. When the Si columns are disposed in a diagonal lattice, the Si columns connected to one word line may be disposed in a zigzag pattern or a serrated pattern in which each segment is constituted by a plurality of Si columns. The same applies to other embodiments.

Various embodiments and modifications can be made to the present invention without departing from the spirit and scope of the present invention in a broad sense. The above-described embodiments are intended to explain examples of the present invention and are not intended to limit the scope of the present invention. Any of the above-described embodiments and modifications can be combined. Further, the above-described embodiments from which some of the configuration requirements are removed as needed are also within the scope of the technical spirit of the present invention.

With the semiconductor-element-including memory device according to the present invention, a high-density and high-performance dynamic flash memory that is an SGT-including memory device can be obtained.

What is claimed is:

1. A semiconductor-element-including memory device that is a memory device in which in plan view on a substrate, a plurality of pages are arranged in a column direction, each of the pages being constituted by a plurality of memory cells arranged in a row direction, each of the memory cells included in each of the pages comprising:

a semiconductor body that stands on the substrate in a vertical direction or that extends along the substrate in a horizontal direction;

a first impurity region and a second impurity region that are disposed at respective ends of the semiconductor body;

a gate insulator layer that is in contact with a side surface of the semiconductor body between the first impurity region and the second impurity region;

a first gate conductor layer that partially or entirely covers the gate insulator layer; and a second gate conductor layer that is adjacent to the first gate conductor layer and that is in contact with a side surface of the gate insulator layer, wherein voltages applied to the first impurity region, the second impurity region, the first gate conductor layer, and the second gate conductor layer are controlled to perform a page write operation, a page erase operation, and a page read operation, and in the page write operation, a group of positive holes generated by an impact ionization phenomenon are retained inside the semiconductor body at a first time, and a page write post-processing operation of making a group of excess positive holes among the group of positive holes disappear is performed at a second time subsequent to the first time.

2. The semiconductor-element-including memory device according to claim 1, wherein in the page write operation, a voltage of the semiconductor body is made equal to a first data retention voltage that is higher than a voltage of one of the first impurity region or the second impurity region or higher than voltages of both of the first impurity region and the second impurity region, and in the page erase operation, the voltages applied to the first impurity region, the second impurity region, the first gate conductor layer, and the second gate conductor layer are controlled to make the group of positive holes in the semiconductor body disappear, and the voltage of the semiconductor body is made equal to a second data retention voltage that is lower than the first data retention voltage.

3. The semiconductor-element-including memory device according to claim 1, wherein the first impurity region is connected to a source line, the second impurity region is connected to a bit line, one of the first gate conductor layer or the second gate conductor layer is connected to a word line, and the other of the first gate conductor layer or the second gate conductor layer is connected to a plate line, and voltages applied to the source line, the bit line, the word line, and the plate line are controlled to perform the page write operation, the page erase operation, the page read operation, and the page write post-processing operation.

4. The semiconductor-element-including memory device according to claim 3, wherein in the page write post-processing operation, a pulse voltage is applied to at least one of the source line, the bit line, the word line, or the plate line.

5. The semiconductor-element-including memory device according to claim 3, wherein in the page write post-processing operation, voltages identical to voltages applied in the page read operation are applied to the bit line, the word line, and the plate line.

6. The semiconductor-element-including memory device according to claim 3, wherein in the page write post-processing operation, a voltage higher than a voltage applied in the page read operation is applied to at least one of the bit line, the word line, or the plate line.

7. The semiconductor-element-including memory device according to claim 4, wherein in the page write post-processing operation, the pulse voltage is applied at least once to a page selected from among the pages.

8. The semiconductor-element-including memory device according to claim 3, wherein the word line and the plate line are disposed in parallel in plan view, and the bit line is disposed in a direction perpendicular to the word line and the plate line in plan view.

9. The semiconductor-element-including memory device according to claim 3, wherein a first gate capacitance between the semiconductor body and the first gate conductor layer or the second gate conductor layer to which the plate line is connected is larger than a second gate capacitance between the semiconductor body and the first gate conductor layer or the second gate conductor layer to which the word line is connected.

10. The semiconductor-element-including memory device according to claim 3, wherein in plan view, the source line includes isolated source lines that are disposed for respective groups of memory cells arranged in the column direction and that are disposed parallel to the word line and the plate line.

11. The semiconductor-element-including memory device according to claim 3, wherein in plan view, the source line is disposed so as to be shared between pages adjacent to each other.

12. The semiconductor-element-including memory device according to claim 3, wherein in plan view, the plate line is disposed so as to be shared between at least two or more pages adjacent to each other.

13. The semiconductor-element-including memory device according to claim 1, wherein the first gate conductor layer is constituted by two divided gate conductor layers isolated from each other, and the divided gate conductor layers are positioned on respective sides of the second gate conductor layer, and the page write operation, the page erase operation, the page read operation, and the page write post-processing operation are performed.

14. The semiconductor-element-including memory device according to claim 1, wherein the second gate conductor layer is constituted by two divided gate conductor layers isolated from each other, and the divided gate conductor layers are positioned on respective sides of the first gate conductor layer, and the page write operation, the page erase operation, the page read operation, and the page write post-processing operation are performed.

15. The semiconductor-element-including memory device according to claim 1, wherein
the semiconductor body is a P-type semiconductor layer, and the first impurity region and the second impurity region are N-type semiconductor layers.

16. The semiconductor-element-including memory device according to claim 1, wherein
in the page erase operation, selective erasing is performed for at least two pages.

17. The semiconductor-element-including memory device according to claim 3, wherein
the word line and the plate line are connected to a row decoder circuit, the row decoder circuit receives a row address, and a page is selected from among the pages in accordance with the row address.

18. The semiconductor-element-including memory device according to claim 3, wherein
the bit line is connected to a sense amplifier circuit, the sense amplifier circuit is connected to a column decoder circuit, the column decoder circuit receives a column address, and the sense amplifier circuit is selectively connected to an input/output circuit in accordance with the column address.

* * * * *

UNITED STATES PATENT AND TRADEMARK OFFICE
CERTIFICATE OF CORRECTION

| | | |
|---|---|---|
| PATENT NO. | : 12,362,006 B2 | Page 1 of 1 |
| APPLICATION NO. | : 18/333674 | |
| DATED | : July 15, 2025 | |
| INVENTOR(S) | : Koji Sakui et al. | |

It is certified that error appears in the above-identified patent and that said Letters Patent is hereby corrected as shown below:

On the Title Page

Item (56) On Page 2

In the "OTHER PUBLICATIONS", please delete "992201-2227 (2010)" and replace with --pp. 2201-2227 (2010)--

In the "OTHER PUBLICATIONS", please delete "99 767-770" and replace with --pp. 767-770--

Signed and Sealed this
Nineteenth Day of August, 2025

Coke Morgan Stewart
*Acting Director of the United States Patent and Trademark Office*